United States Patent
Turner et al.

(10) Patent No.: US 9,634,179 B2
(45) Date of Patent: Apr. 25, 2017

(54) SELECTIVE REMOVAL OF A COATING FROM A METAL LAYER, AND SOLAR CELL APPLICATIONS THEREOF

(71) Applicant: TETRASUN, INC., San Jose, CA (US)

(72) Inventors: Adrian Bruce Turner, Palo Alto, CA (US); Qing Yuan Ong, San Leandro, CA (US); Oliver Schultz-Wittmann, Sunnyvale, CA (US)

(73) Assignee: TETRASUN, INC., San Jose, CA (US)

( * ) Notice: Subject to any disclaimer, the term of this patent is extended or adjusted under 35 U.S.C. 154(b) by 140 days.

(21) Appl. No.: 14/373,938

(22) PCT Filed: Jan. 23, 2013

(86) PCT No.: PCT/US2013/022674
§ 371 (c)(1),
(2) Date: Jul. 23, 2014

(87) PCT Pub. No.: WO2013/112533
PCT Pub. Date: Aug. 1, 2013

(65) Prior Publication Data
US 2015/0027528 A1    Jan. 29, 2015

Related U.S. Application Data

(60) Provisional application No. 61/589,459, filed on Jan. 23, 2012.

(51) Int. Cl.
*H01L 31/18* (2006.01)
*B23K 26/40* (2014.01)
(Continued)

(52) U.S. Cl.
CPC .......... *H01L 31/1868* (2013.01); *B23K 26/40* (2013.01); *H01L 21/76894* (2013.01);
(Continued)

(58) Field of Classification Search
CPC ............... H01L 31/188; H01L 31/1888; H01L 31/1868; H01L 31/0224; H01L 21/26;
(Continued)

(56) References Cited

U.S. PATENT DOCUMENTS 5,265,114 A * 11/1993 Sun ...................... B23K 26/362
257/E21.596
7,405,033 B2    7/2008 Yamazaki et al.
(Continued)

FOREIGN PATENT DOCUMENTS

CN    101142690 A    3/2008
JP    04-259285 A    9/1992
(Continued)

OTHER PUBLICATIONS

JP 2000-312016 English machine translation.*
(Continued)

*Primary Examiner* — Allison Bourke
*Assistant Examiner* — Andrew Golden
(74) *Attorney, Agent, or Firm* — Kevin P. Radigan, Esq.; Heslin Rothenberg Farley & Mesiti P.C.

(57) ABSTRACT

A method and resulting structure of patterning a metal film pattern over a substrate, including forming a metal film pattern over the substrate; depositing a coating over the substrate surface and the metal film pattern; and removing the coating over the metal film pattern by laser irradiation. The substrate and coating do not significantly interact with the laser irradiation, and the laser irradiation interacts with the metal film pattern and the coating, resulting in the removal of the coating over the metal film pattern. The invention offers a technique for the formation of a metal pattern surrounded by a dielectric coating for solar cells, where the dielectric coating may function as an antireflection coating on the front surface, internal reflector on the rear
(Continued)

surface, and may further may function as a dielectric barrier for subsequent electroplating of metal patterns on either surface.

18 Claims, 10 Drawing Sheets

(51) Int. Cl.
*H01L 21/768* (2006.01)
*H01L 31/0216* (2014.01)
*H01L 31/0224* (2006.01)

(52) U.S. Cl.
CPC ............ *H01L 31/02168* (2013.01); *H01L 31/022425* (2013.01); *H01L 31/022433* (2013.01); *H01L 31/022441* (2013.01); *H01L 31/1884* (2013.01); *H01L 31/1888* (2013.01); *Y02E 10/50* (2013.01); *Y02E 10/52* (2013.01)

(58) Field of Classification Search
CPC ............ H01L 21/268; H01L 21/76894; H01L 23/5258; H01L 23/5256; H01L 31/1804; B23K 26/362; B23K 26/364; B23K 26/36; B23K 26/40
USPC ............................ 136/243–265; 438/940, 57
See application file for complete search history.

(56) References Cited

U.S. PATENT DOCUMENTS

| | | | |
|---|---|---|---|
| 7,927,497 B2 | 4/2011 | Lim et al. | |
| 2002/0153039 A1* | 10/2002 | Moon | H01L 31/022425 136/256 |
| 2008/0105303 A1* | 5/2008 | Oswald | H01L 31/046 136/261 |
| 2008/0216890 A1* | 9/2008 | Lim | H01L 31/022466 136/252 |
| 2010/0319767 A1 | 12/2010 | Sauar | |
| 2011/0312123 A1 | 12/2011 | Jeong et al. | |
| 2014/0273431 A1 | 9/2014 | Sasagawa | |

FOREIGN PATENT DOCUMENTS

| | | |
|---|---|---|
| JP | 2000312016 A | 11/2000 |
| JP | 2009283549 A | 12/2009 |
| JP | 2010502021 A | 1/2010 |
| JP | 2011-114194 A | 6/2011 |
| KR | 1020060100108 A | 9/2006 |
| KR | 20100131203 A | 12/2010 |
| KR | 1020100131203 A | 12/2010 |

OTHER PUBLICATIONS

International Search Report for PCT/US2013/022674 dated May 16, 2013.
Turner et al., First Office Action for CN Application No. 2013800086025, including English translation, dated Nov. 4, 2015 (15 pages).
Heinrich et al., "Non-Linear Absorption of Femotosecond Laser Pulses in a SiNx Layer—Influence of Silicon Doping Type", Solar Energy Materials & Solar Cells, vol. 120 (2014) (pp. 317-322).
Turner et al., Notification of Transmittal of the International Search Report & Written Opinion for PCT/US2016/031269, dated Nov. 28, 2016 (8 pages).

* cited by examiner

SELECTIVE REMOVAL OF A COATING FROM A METAL LAYER, AND SOLAR CELL APPLICATIONS THEREOF

CROSS-REFERENCE TO RELATED APPLICATIONS

This application is a national stage filing under section 371 of International Application No. PCT/US2013/022674, filed on Jan. 23, 2013, and published on Aug. 1, 2013 as WO 2013/112533 A1. In addition, this Application claims priority from U.S. Provisional Application No. 61/589,459 filed Jan. 23, 2012. This Application is also related to PCT Application Serial No. PCT/US2010/031869, filed Apr. 21, 2010, which was published on Oct. 28, 2010, as International Publication No. WO 2010/123974 A1, and which claims priority from U.S. Provisional Application No. 61/171,194, filed Apr. 21, 2009, and entitled "High-Efficiency Solar Cell Structures and Methods of Manufacture." Each of these Applications is hereby incorporated herein by reference in its entirety. All aspects of the present invention may be used in combination with the disclosures of the above-noted Applications.

TECHNICAL FIELD

The present invention relates to solar cells and modules. More particularly, the present invention relates to improved solar cell structures and methods of manufacture for increased cell efficiency.

BACKGROUND OF THE INVENTION

Solar cells are providing widespread benefits to society by converting essentially unlimited amounts of solar energy into useable electrical power. As their use increases, certain economic factors become important, such as high-volume manufacturing and efficiency.

With reference to the schematic, cross-sectional views of the exemplary solar cells of FIGS. 1-2, solar radiation is assumed to preferentially illuminate one surface of a solar cell, usually referred to as the front side. In order to achieve a high energy conversion efficiency of incident photons into electric energy, an efficient absorption of photons within a silicon wafer is important. This can be achieved by a good surface texturing and antireflection coating on the front side and a low parasitic absorption within all layers except the wafer itself. An important parameter for high solar cell efficiency is the shading of the front surface by metal electrodes. In general, the optimized metal grid is a tradeoff of losses between shading and electrical resistance of the metal structure. The optimization for efficiency of the solar cell requires a grid with very fine fingers and short distances in between those fingers, which should have a high electrical conductivity. A practical technique for forming this structure is the subject of this invention.

Some solar cell production technologies may use screen printing technology to print the electrode on the front surface. A silver paste may be printed on top of a silicon nitride antireflection coating and fired through the coating in a high temperature process. This is a short process sequence and has therefore gained the highest market share in crystalline silicon solar cell technology. However, certain inherent properties of this approach include a comparatively broad line width in excess of 50 um, typically about 100 um, and a fairly low line conductivity of the metal grid due to the use of several non-metallic components in the printed paste. Also, the firing process results in a penetration of the metal paste ingredients through the antireflection layer into the substrate where increased recombination occurs. This holds for both cases of a front junction device where the pn junction can be severely damaged by unwanted penetration of the space charge region as well as for back junction devices where the front surface recombination is increased and significantly reduces the collection efficiency of the back junction emitter.

An improved structure for the front side metallization is shown in FIG. 1—an optimized front contact structure for a high-efficiency solar cell. The antireflection dielectric coating 2 covers the substrate 1 on the entire surface except underneath the metal contact 4. The line width of the metallization line 4 is on the order of 50 um or less and the total surface coverage with metal of the front side is about 7% or less.

The thin metal contact 4 can subsequently be plated 4' to the required thickness in order to obtain a higher conductivity. FIG. 2 shows that the metal contact line 4 may be used as a seed layer to start plating of the electrode 4' to a desired thickness. Using electroplating for the buildup of the line conductivity, a sufficient thickness of the metal layer 4 on the order of ~50-500 nm is required in order to enable good plated metal 4' uniformity. When plating is performed the antireflection coating 2 must also function as a plating barrier to prevent metal plating onto the surface of the substrate, and for this reason alone the antireflection coating must be a good electrical insulator, e.g. a largely intact dielectric film.

State of the art technologies for the formation of conductive metal grids on solar cells are too expensive and/or have specific performance limitations. A simple, high performance and cost effective means for the formation of conductive metal grids on solar cells is therefore required.

SUMMARY OF THE INVENTION

The present invention comprises a technique to manufacture conductive metal grids on substrates, for example solar cells, by employing selective laser ablation of a dielectric coating from a metal pattern.

The present invention in one aspect is a method, and resulting structure, of patterning a metal film pattern over a substrate, comprising forming a metal film pattern over the substrate; depositing a coating over the substrate surface and the metal film pattern; and removing the coating over the metal film pattern by laser irradiation. The metal film pattern may be formed by depositing a metal film over a surface of the substrate; depositing an etch resist over the metal film; etching the metal film; and removing the etch resist. The metal film pattern may be formed by screen printing metal pastes, inkjet printing nanoparticle metal inks, or aerosol printing metal nanoparticles.

In one aspect, the substrate and coating do not significantly interact with the laser irradiation, and the laser irradiation interacts with the metal film pattern and the coating, resulting in the removal of the coating over the metal film pattern. The laser irradiation may partially remove or disrupt the coating over the metal film pattern.

The substrate may comprise a substrate for a solar cell, and the metal film pattern forms the front and/or back contact electrode of a solar cell. The metal film pattern may be subsequently electroplated with metal to improve electrical conductivity of the metal film pattern. The coating may be a dielectric optical antireflection layer or an optical reflecting layer.

The present invention includes a structure formed according to any of the methods described herein, wherein over a substrate, a metal film finger pattern is surrounded by a coating and where no gap exists between the metal film fingers and the surrounding coating.

In one embodiment, a resist is used to locally etch back a metal layer followed by the deposition of a dielectric coating on the full area including the metallized area, and the selective laser ablation of the dielectric coating from on top of the metal.

In a further embodiment, inkjet or aerosol printing of metal nanoparticles is used to form a metal pattern which is followed by the deposition of a dielectric coating on the full area including the metallized area, and the selective laser ablation of said dielectric coating from on top of the metal.

In a further embodiment, screen printing of metal paste is used to form a metal pattern, which is followed by the deposition of a dielectric coating on the full area including the metallized area, and the selective laser ablation of the dielectric coating from on top of the metal.

The present invention offers many distinct advantages over current state of the art. Specifically, it is a simple technique for the formation of a metal pattern 4 surrounded by a dielectric coating 2 for solar cells, where the dielectric coating may function as an antireflection coating on the front surface, internal reflector on the rear surface, and may further may function as a dielectric barrier for subsequent electroplating of metal patterns on either surface. Also, the present invention offers a favorable way of fabricating interdigitated contact grids for contact structures that are fabricated on one side of the substrate only.

In one embodiment of this invention very fine metal patterns may be generated, as the dielectric coating is selectively removed by laser ablation only from those substrate areas covered with patterned metal even though a larger area of the substrate is irradiated by the laser beam. This selective laser ablation of the dielectric coating 2 is a self-aligned patterning process as it relies on an interaction between the laser irradiation, the metal 4 and the overlying dielectric coating 2' for the removal of the dielectric coating. The dielectric coating 2 and substrate 1 in those areas not covered by metal is largely unaffected by the laser irradiation, even though these areas may be irradiated by the same laser beam. This self-aligned laser ablation of the dielectric coating means that very narrow metal patterns as in FIG. 1 may be generated, the size of the dielectric coating opening only being governed by the metal pattern size and the wavelength of the laser irradiation. Furthermore, such a self-aligned selective laser ablation patterning is a simple, high yield and cost effective manufacturing process.

The selective laser ablation patterning of the dielectric coating 2 avoids any gap between the metal and the dielectric antireflection coating as otherwise can be observed in techniques such as metal lift-off. This is important because the dielectric coating acts as a barrier between the substrate and any plated metal and the surrounding environment.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in combination with the accompanying drawings in which:

FIGS. 3-16 are schematic, partial cross-sectional views of a solar cell showing an example embodiment of the invention in which a metal etch resist is used to form a metal grid pattern for e.g., a solar cell, as follows:

FIG. 3 shows a metal film deposited on a substrate;

FIG. 4 shows a narrow resist line dispensed over the metal layer;

FIG. 5 shows the metal film etched except for the part covered by resist;

FIG. 6 shows the resist removed, leaving the narrow line metal pattern on the substrate;

FIG. 7 shows a dielectric coating deposited across the front surface;

FIG. 8 shows laser irradiation applied to the substrate, resulting in the structure shown in FIG. 9;

FIG. 9 shows that after the removal of the dielectric layer, the metal structure and the dielectric layer cover the substrate without any gap between the metal film and the dielectric coating;

FIG. 10 shows the metal grid pattern thickened by plating to achieve the required line conductivity;

FIG. 11 shows a nominal metal pattern as it may appear on the front and/or back side of a solar cell;

FIG. 13 shows a simplified diagram of a laser machining system suitable for performing the laser processing of the present invention;

FIG. 14 shows an example of two applicable beam intensity power density or fluence profiles in accordance with the present invention.

DETAILED DESCRIPTION OF THE INVENTION

Figure 1:
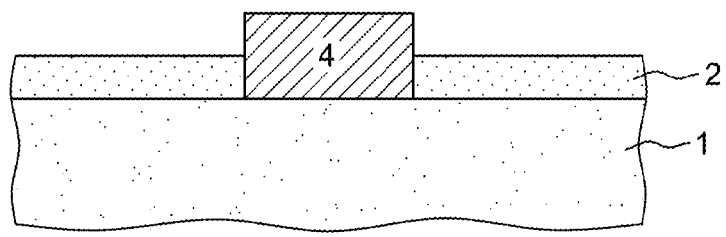
FIG. 1 is a schematic, partial cross-sectional view of a solar cell, with an optimized front contact structure for a high-efficiency solar cell.
Figure 2:
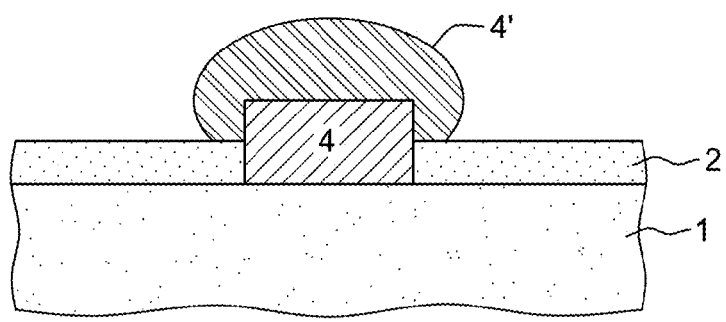
FIG. 2 shows that the metal contact line 4 may be used as a seed layer to start plating the electrode 4' to a desired thickness.
Figure 3:
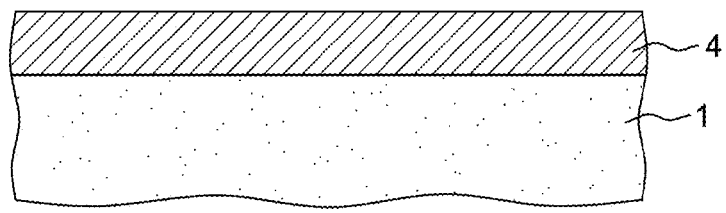

FIGS. 3-16 (where like reference numerals are used to refer to like elements) show an example embodiment of the invention which uses a metal etch resist to form a metal grid pattern for e.g., a solar cell. It is understood that many techniques exist for the formation of a metal patterns on a substrate in accordance with the invention and that the sequence presented is only one possible example.

Initially, a substrate 1 is supplied. This substrate may be a silicon semiconductor wafer of either p or n-type doping. The substrate may be textured, for example with a random pyramid pattern to improve light trapping in the solar cell. The substrate may have dopant diffusions on either or both sides to form emitter structures or surface fields. Such dopant diffusions may be patterned, for example to form so-called selective emitter structures. The substrate may have thin film passivation layers present on either or both surfaces. Such passivation layers may for example consist of doped or intrinsic amorphous silicon layers, silicon dioxide, silicon nitride, doped or intrinsic poly-silicon, doped or intrinsic silicon carbide, aluminum oxide or any of a large variety of such passivation layers and combinations thereof A metal film 4 is deposited over a surface of the substrate, and the structure shown in FIG. 3 results, which shows a metal film 4 over substrate 1. Such metal deposition may, for example, be performed using well established techniques such as sputtering, thermal evaporation or e-beam evaporation. It is understood that this metal film may consist of multiple different metal layers where these metal layers are required to perform different functions. For example, a bottom—next to the substrate—metal layer may be required to form good electrical contact and adhesion to the substrate, a top or middle metal layer may be required to act as a diffusion barrier, and a top metal layer may need to function as an electroplating seed. Further, it is understood that the metal film may require specific properties, for example thickness and/or composition, to enable the subsequent selective dielectric laser ablation.

Figure 4:
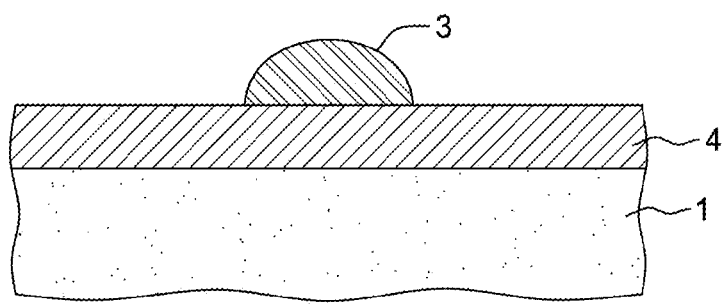

A narrow resist line 3 is dispensed over the metal film 4, and the structure shown in FIG. 4 results.

The resist may form any pattern on the surface of the substrate. In the case of a solar cell such a pattern may, for example, consist of many narrow fingers and several wider bus-bars. The resist 3 may be dispensed, for example, by inkjet or screen printing. Alternatively the narrow resist line 3 could be formed by photolithographic means.

Figure 5:
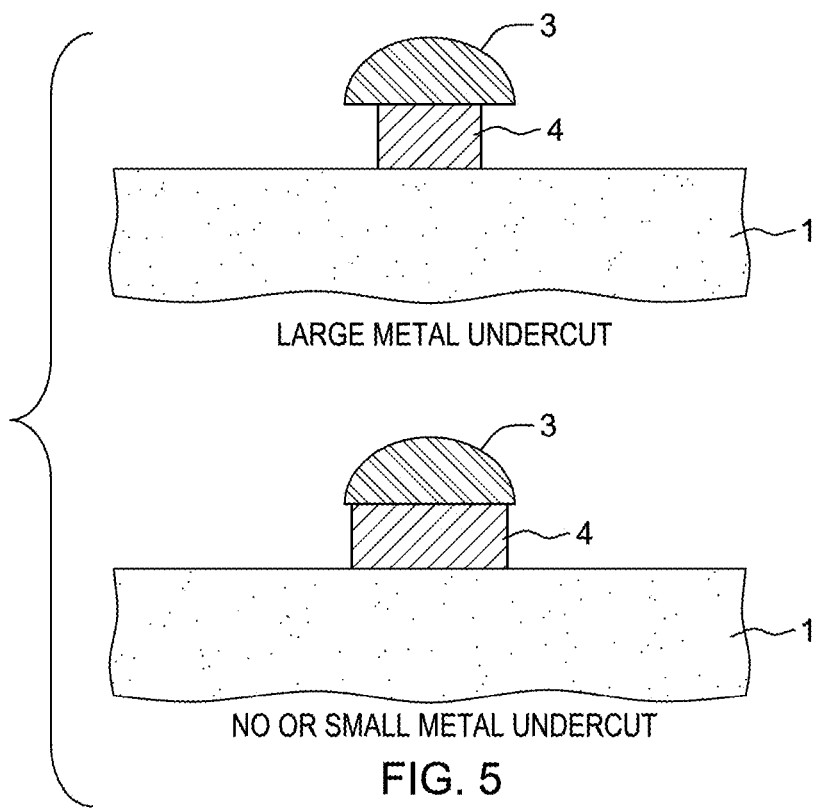

The metal film 4 is etched except for the parts covered by resist 3, and the structure shown in FIG. 5 results. Metal etching may, for example, be performed by acid etching. The degree of metal etching can be controlled to create a large or small or no undercut thus defining the final line width.

Figure 6:
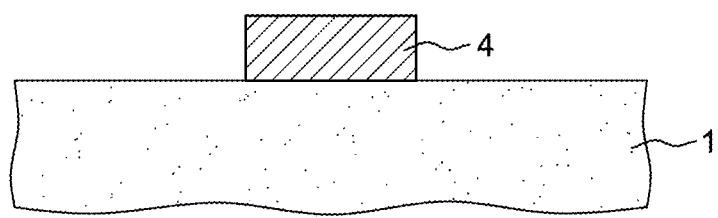

The resist is removed and a metal pattern 4 is left on the substrate, and the structure shown in FIG. 6 results.

In the case of the front surface of a solar cell, finger widths of less than 50 um can be readily achieved.

Figure 7:
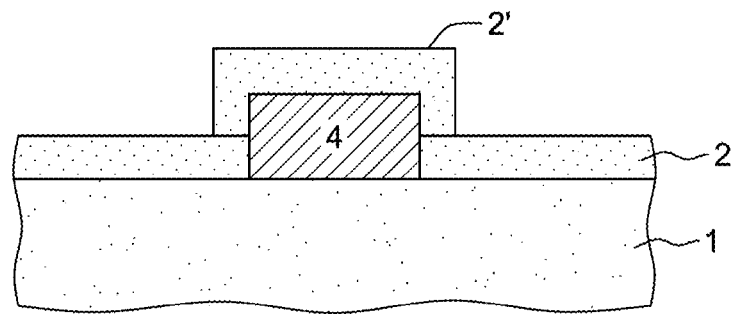

A dielectric coating 2 is deposited across the entire surface, and the structure shown in FIG. 7 results. In parts, the dielectric coating overlays 2' the metal film 4

Such dielectric deposition may, for example, be performed using well established techniques such as sputtering, dip coating, chemical vapor deposition and plasma enhanced chemical vapor deposition. In the case of the front surface of a solar cell it is understood that this dielectric coating 2 may function as an antireflection coating and may also passivate the surface of the solar cell. Further, it is understood that this dielectric layer may be composed of multiple different layers and/or graded layers, to, for example, implement well known techniques to improve antireflection properties.

Figure 8:
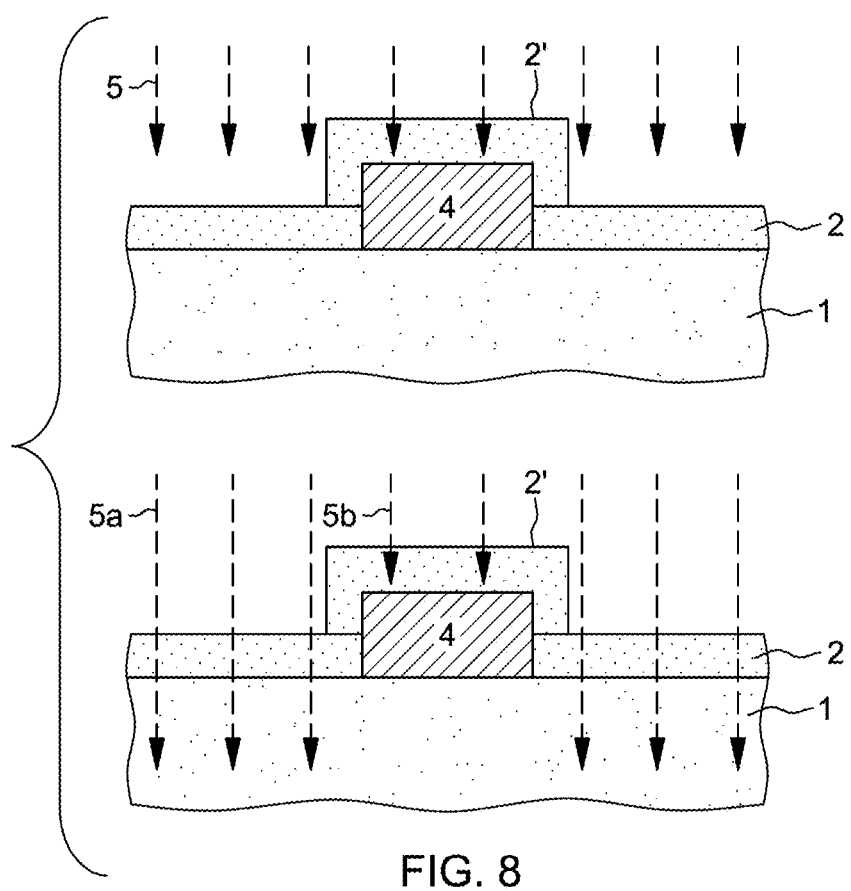
Figure 9:
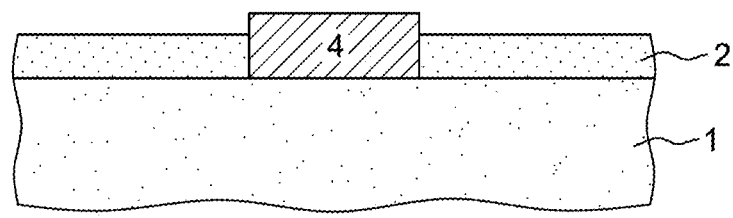

The surface of the substrate is irradiated with a laser beam 5, as shown in FIG. 8, which shows a laser irradiation 5 applied to the structure, resulting in the structure shown in FIG. 9. In one embodiment, the laser irradiation parameters are chosen such that neither the dielectric coating 2 nor the substrate 1 significantly interact with the beam—the laser beam 5a passes though these areas without causing significant damage. The laser irradiation parameters are chosen to significantly interact with the metal film 4, and the laser beam is absorbed 5b in the metal film 4. This absorption can result in the partial ablation of the metal film, specifically a thin layer at the surface of the metal may be ablated. This interaction leads to the local removal of the dielectric coating overlying 2' the metal film 4.

The entire surface of the substrate may be irradiated or alternatively only those areas which have a metal pattern may be irradiated.

As a result of this selective dielectric ablation the structure shown in FIG. 9 results, which shows that after the removal of the dielectric layer 2 the metal structure 4 and the dielectric layer 2 cover the entire substrate 1 without any gaps between the metal film and the dielectric coating.

Figure 10:
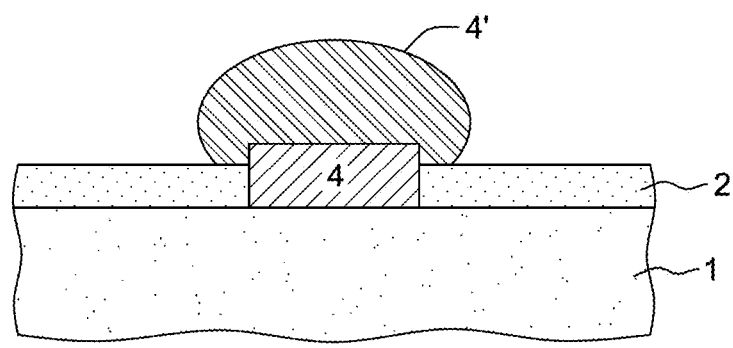

Subsequent processes may now be performed on the substrate, for example cleaning to remove debris or thermal treatment to improve electrical contact. In the case of the front surface of a silicon solar cell the metal film 4 may be thickened by plating 4', as shown in FIG. 10, to achieve the required line conductivity. The dielectric coating 2 serves as a barrier between the plated metal 4' and the substrate.

Taken together, this example illustrates a simple process sequence for the formation of metal contact structures for solar cells. The process sequence is as follows in one example:

1. Deposit metal film on substrate.
2. Dispense resist.
3. Etch metal and remove resist.
4. Deposit dielectric film.
5. Laser ablate.
6. Plate.

Further, it is understood that such a process sequence is applicable to forming contact structures on the front and/or back surface of solar cells. Further, it is understood that the sequence may be implemented on both the front and back surfaces simultaneously without adding additional process steps.

Selective Laser Ablation Example

Figure 11:
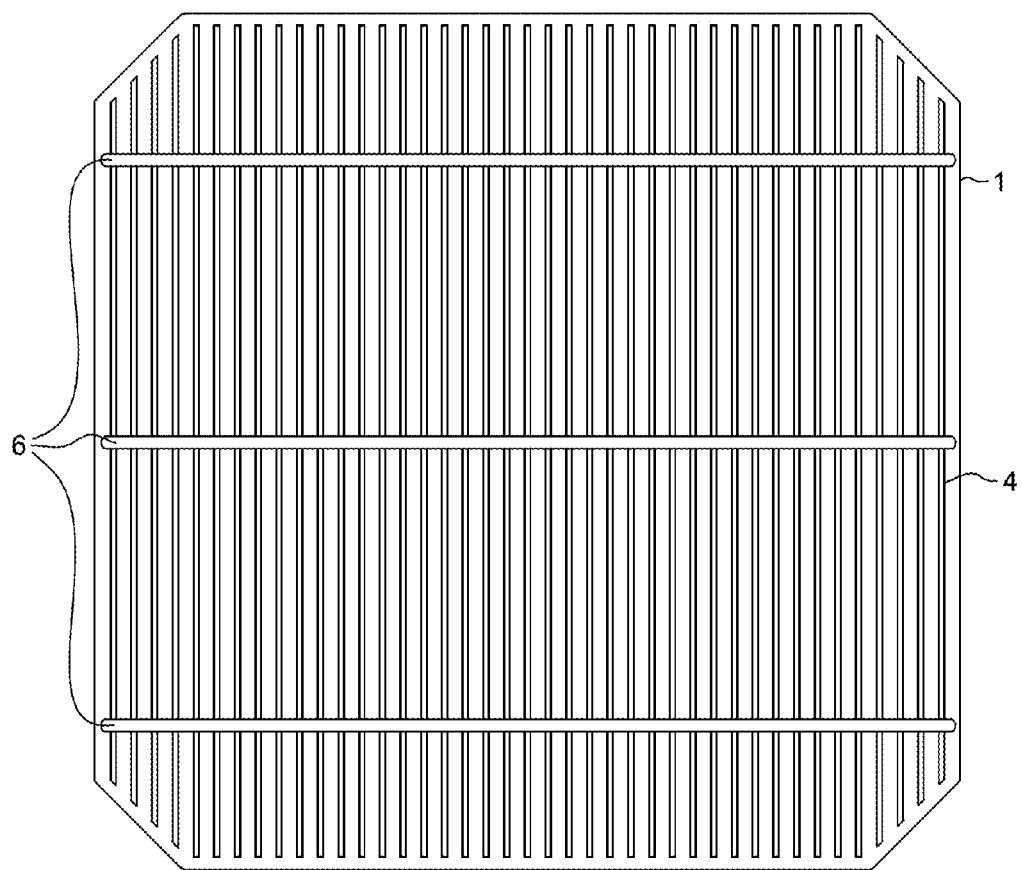

FIG. 11 shows a nominal metal pattern as it may appear on the front and/or back side of a solar cell substrate 1. The metal pattern may for example consist of bus-bars 6 and narrow line fingers 4.

Figure 12A:
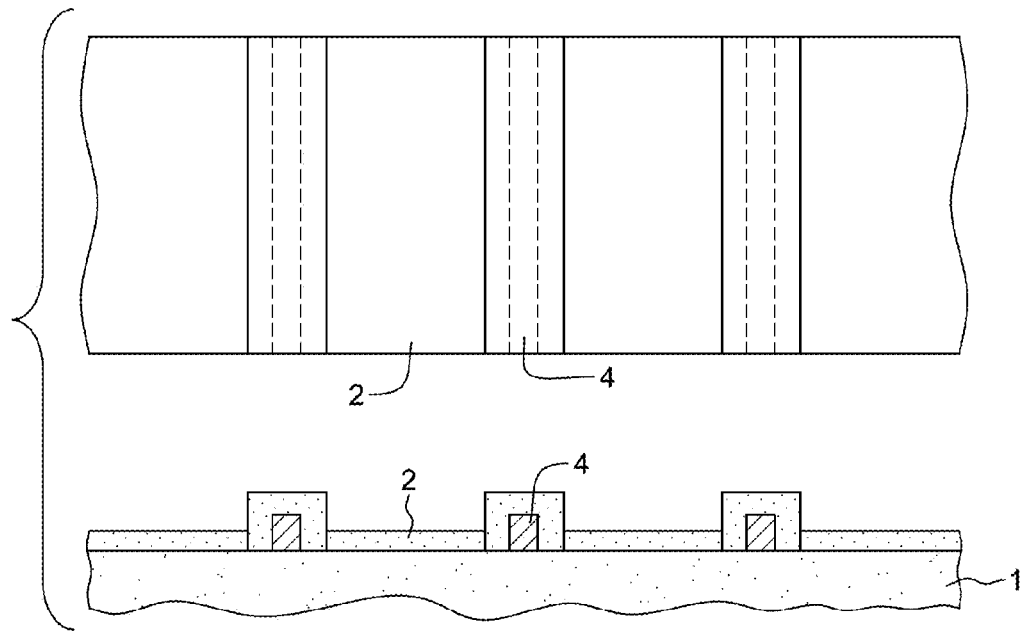
FIGS. 12a-b are planar and sectional views showing details of narrow line metal fingers.
Figure 12B:
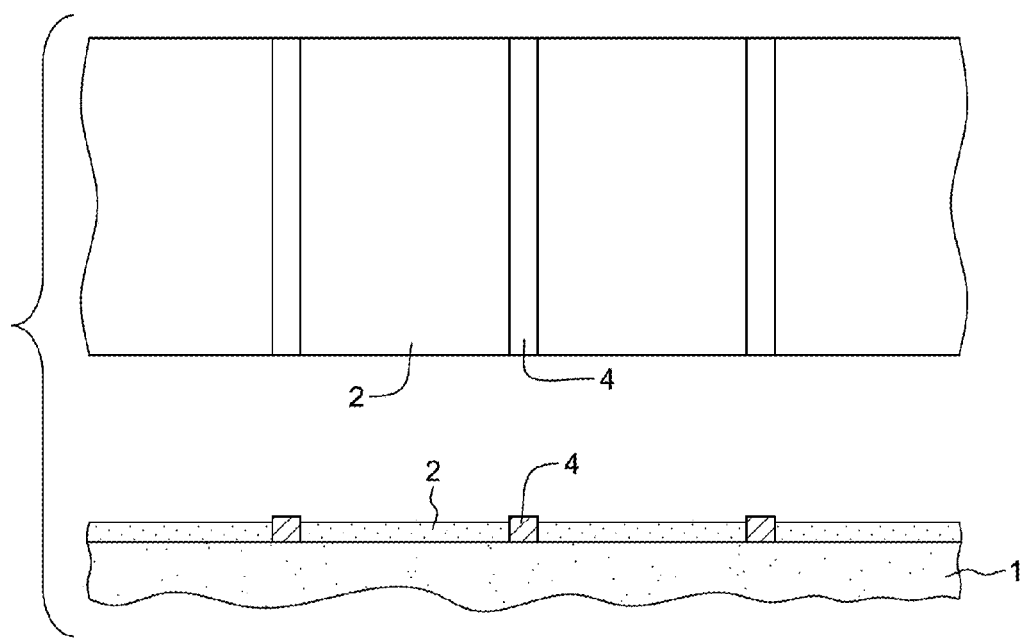

FIGS. 12a-b are planar and sectional views showing details of narrow line metal fingers 4 as they may appear in a part of the solar cell. FIG. 12a (planar and sectional views) shows the dielectric coating 2 covering the metal fingers 4. FIG. 12b (planar and sectional views) shows the cell after laser irradiation has removed the dielectric coating from the top of the metal fingers.

Figure 13:
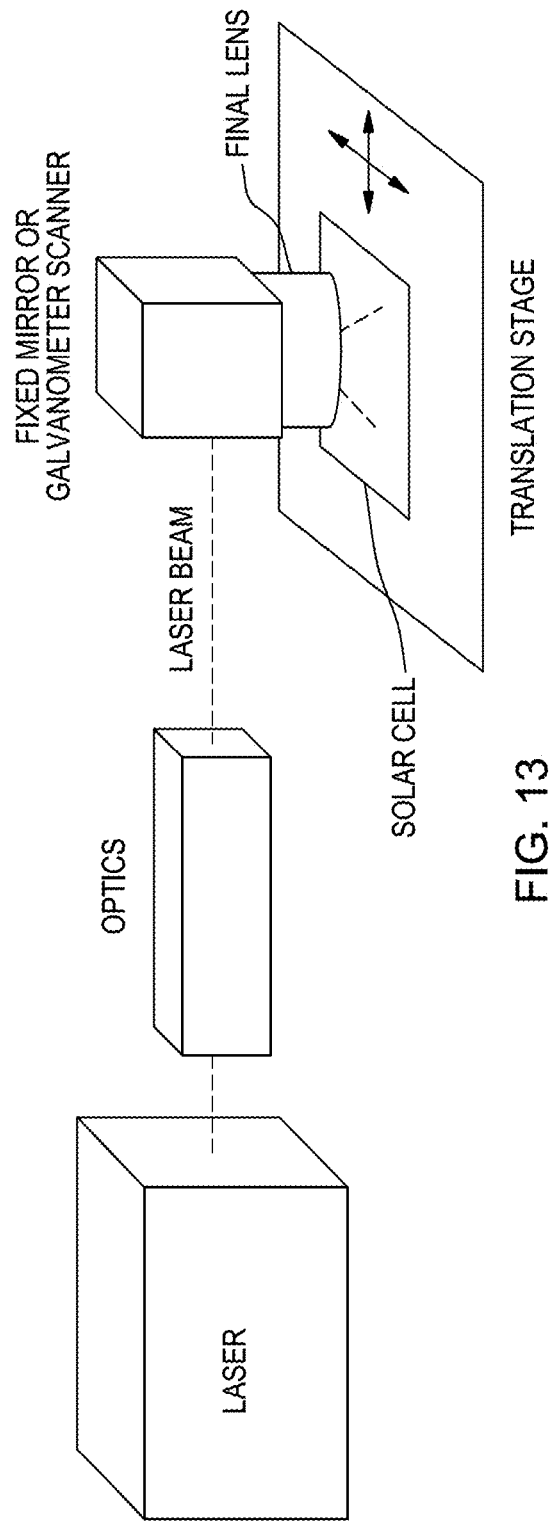

FIG. 13 shows a simplified diagram of a laser machining system suitable for performing the laser processing in accordance with the present invention. The laser beam is generated in the laser. The laser beam is fed through optional external optics which may include components such as a beam expander, beam collimator, beam homogenizer, imaged mask, fiber beam delivery system, variable attenuator, relay lenses and mirrors. A galvanometer scanner and/or a translation stage may be used to translate the laser beam to cover the substrate e.g., for a solar cell. The final lens is used to focus the beam onto the substrate e.g., for a solar cell. Such a laser machining system arrangement, as illustrated in FIG. 13, is readily available and applicable to high throughput industrial applications such as solar cell manufacturing.

Figure 14:
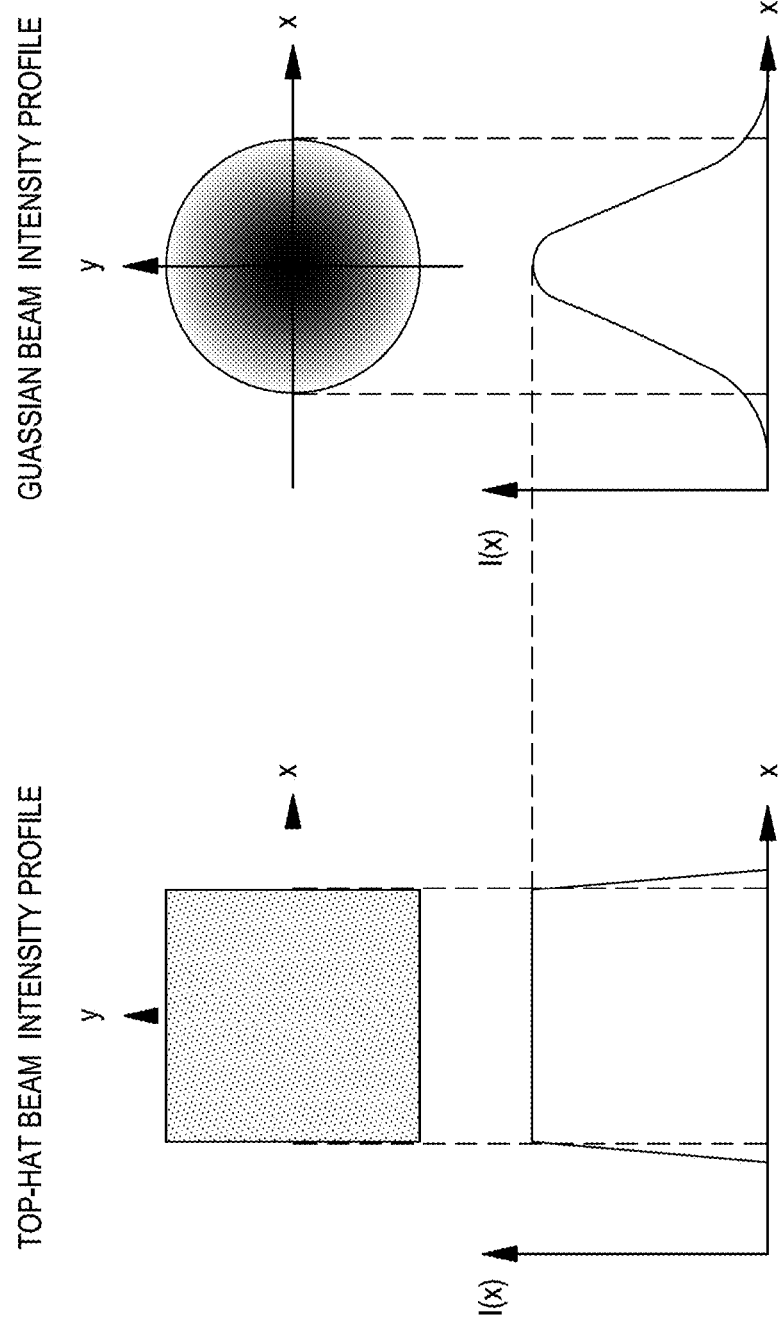

This invention may use different laser beam intensity profiles. FIG. 14 shows an example of two applicable beam intensity (power density or fluence) profiles.

A Gaussian beam profile, or close to Gaussian, is one typically generated by many laser sources, the intensity distribution in any transverse plane is a circularly symmetric Gaussian function centered about the beam axis. An alternative beam profile shown is the so-called "Top-Hat" or "Flat-Top" beam profile. Such a profile ideally has a near-uniform intensity within the exposure area. The Top-Hat exposure area shape may be circular, square, rectangular or any shape generated by appropriate optics. Such a Top-Hat beam profile is typically generated using special diffractive or refractive optics, or multimode fibers, called beam shapers. Either of these profiles or combinations or variations thereof may be used for laser processing according to the present invention.

FIGS. 15a-b and 16a-b show examples of how a square top-hat beam profile may be scanned or translated over a substrate, in a process for the self-aligned selective laser ablation of dielectric coating overlying a patterned metal film 4. As can be seen this process is tolerant to variations in the size, placement and shape of the narrow metal fingers. It is understood that a variety of different beam scanning, overlap and placement schemes are applicable to this invention and that the two shown are only representative examples of the general principle.

Figure 15A:
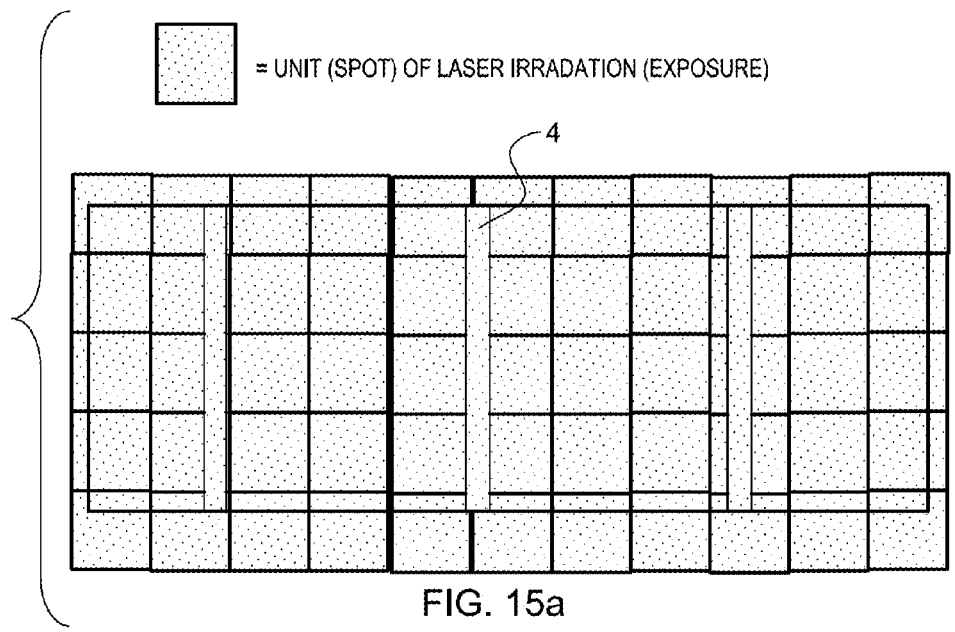
FIGS. 15a-b and 16a-b show examples of how a square top-hat beam profile may be scanned or translated over a substrate, in a process for the self-aligned selective laser ablation of dielectric coating overlying a patterned metal film, in accordance with the present invention.
Figure 15B:
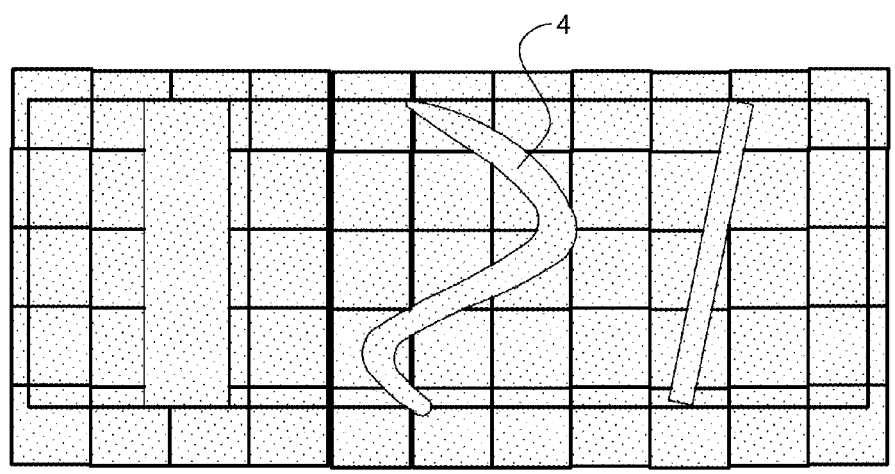

FIGS. 15a-b show an example of full area laser irradiation using a square top-hat profile laser beam spot. The square spot is scanned or translated to cover the entire process area. As can be seen from FIG. 15b, for a self-aligned selective laser ablation process removing a dielectric coating overlying a patterned metal film 4, this irradiation pattern functions irrespective of the size, position or shape of the patterned metal film 4.

Figure 16A:
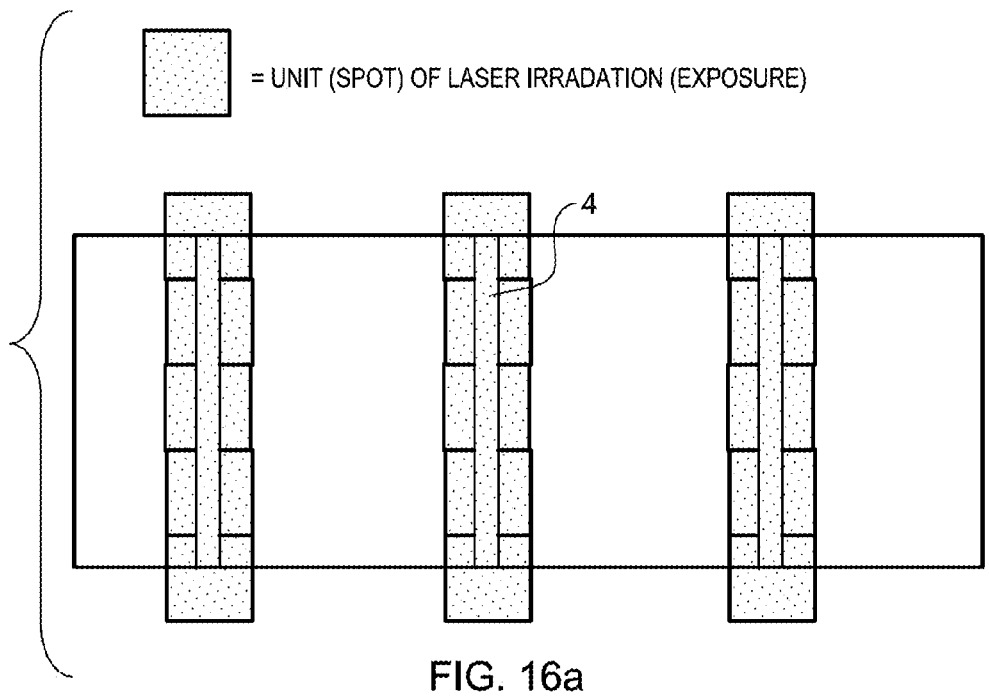
Figure 16B:
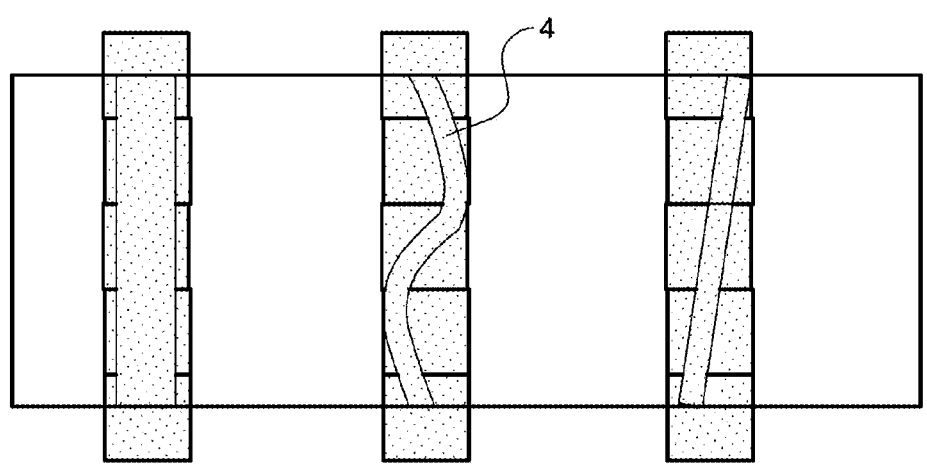

FIGS. 16a-b show an example of aligned laser irradiation pattern using a square top-hat profile laser beam spot. The square spot is scanned or translated to cover the narrow metal fingers 4. As can be seen from FIG. 16b, for a selective laser ablation process removing a dielectric coating overlying a patterned metal film 4, this irradiation pattern does not need to accurately track variations in the size, position or shape of the narrow metal lines 4.

The present invention is therefore a method of patterning a metal film pattern over a substrate, comprising forming a metal film pattern over the substrate; depositing a coating over the substrate surface and the metal film pattern; and removing the coating over the metal film pattern by laser irradiation. The metal film pattern may be formed by depositing a metal film over a surface of the substrate; depositing an etch resist over the metal film; etching the metal film; and removing the etch resist. The metal film pattern may be formed by screen printing metal pastes, inkjet printing nanoparticle metal inks, or aerosol printing metal nanoparticles.

In one aspect, the substrate and coating do not significantly interact with the laser irradiation, and the laser irradiation interacts with the metal film pattern and the coating, resulting in the removal of the coating over the metal film pattern. The laser irradiation may partially remove or disrupt the coating over the metal film pattern.

The substrate may comprise a substrate for a solar cell, and the metal film pattern forms the front and/or back contact electrode of a solar cell. The metal film pattern may be subsequently electroplated with metal to improve electrical conductivity of the metal film pattern. The coating may be a dielectric optical antireflection layer or an optical reflecting layer.

The present invention includes a structure formed according to any of the methods described herein, wherein over a substrate, a metal film finger pattern is surrounded by a coating and where no gap exists between the metal film fingers and the surrounding coating.

The patterned resist may be directly-written and in-situ cured with no need for subsequent pattern mask exposure and developing, wherein the patterning resist direct-write technique is ink-jetting or screen-printing.

The metal film pattern comprises multiple thin film metal layers of varying composition. The metal film pattern or any of the layers may be comprised of one or more of the following metals or metal alloys: chromium, silver, copper, nickel, titanium, aluminum, nickel-vanadium, nickel-niobium, nickel-titanium, nickel-zirconium, nickel-chromium, nickel-platinum, nickel-aluminum, nickel-tungsten, titanium-tungsten, cobalt-nickel, chromium-cobalt-nickel, chromium-cobalt, chromium-nickel, chromium-silicon, chromium-copper, chromium-aluminum, aluminum-silicon-copper, aluminum-silicon, or aluminum-chromium. A top metal film in a stack of multiple thin film metals may be directly electroplate-able and consists of one of the following metal layers: silver, copper, nickel, chromium, nickel-niobium, nickel-vanadium, nickel-titanium, nickel-zirconium, nickel-chromium, nickel-platinum, nickel-aluminum, nickel-tungsten, chromium-cobalt-nickel, chromium-cobalt, chromium-nickel, chromium-silicon, chromium-copper or chromium-aluminum.

The laser irradiation may be pulsed with a pulse width of less than 200 nsec and average power density less than 2 joules per square centimeter, with a wavelength in the range 250 nm to 2000 nm, and ideally in the range 900 nm to 2000 nm, with a top-hat beam profile.

This Application is related to the commonly-assigned, previously filed U.S. Provisional Application entitled "High-Efficiency Solar Cell Structures and Methods of Manufacture," filed 21 Apr. 2009 and assigned application No. 61/171,194; and to commonly-assigned, co-filed International Patent Application entitled "High-Efficiency Solar Cell Structures and Methods of Manufacture" filed as Attorney Docket No. 3304.001AWO and assigned application number PCT/US 10/31869. Each of these Applications is hereby incorporated by reference herein in its entirety. All aspects of the present invention may be used in combination with any of the disclosures of the above-noted Applications.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of patterning a metal film pattern over a substrate of a solar cell, comprising:
   forming a metal film pattern over the substrate of the solar cell;
   depositing a coating over the substrate surface and the metal film pattern; and
   removing the coating over the metal film pattern by laser irradiation of an exposure area comprising the coating over the metal film pattern and the coating over the substrate offset from the metal film pattern, the removing comprising utilizing laser irradiation parameters for the laser irradiation that allow the laser irradiation to interact with metal of the metal film pattern within the exposure area to cause partial ablation of the metal in the metal film pattern and removal or disruption of the coating over the partially ablated metal film pattern, without causing ablation of the substrate or the coating over the substrate within the exposure area, thereby leaving the coating over the substrate within the exposure area offset from the metal film pattern.

2. The method of claim 1, wherein the metal film pattern is formed by:
   depositing a metal film over a surface of the substrate;
   depositing an etch resist over the metal film;
   etching the metal film to form the metal film pattern; and
   removing the etch resist.

3. The method of claim 1, wherein the metal film pattern is formed by screen printing metal pastes, inkjet printing nanoparticle metal inks, or aerosol printing metal nanoparticles.

4. The method of claim 1, wherein the metal film pattern forms the front and/or back contact electrode of the solar cell.

5. The method of claim 1, wherein the metal film pattern is subsequently electroplated with metal to improve electrical conductivity of the metal film pattern.

6. The method of claim 1, wherein the coating is a dielectric optical antireflection layer.

7. The method of claim 1, wherein the coating is an optical reflecting layer.

8. The method of claim 2, wherein the etch resist is directly-written and in-situ cured over the metal film with no need for subsequent pattern mask exposure and developing.

9. The method of claim 8, wherein the etch resist direct-write comprises ink-jetting or screen-printing the etch resist.

10. The method of claim 1, wherein the metal film pattern comprises multiple thin film metal layers of varying composition.

11. The method of claim 1, wherein the metal film pattern comprises one or more of the following metals or metal alloys: chromium, silver, copper, nickel, titanium, aluminum, nickel-vanadium, nickel-niobium, nickel-titanium, nickel-zirconium, nickel-chromium, nickel-platinum, nickel- aluminum, nickel-tungsten, titanium-tungsten, cobalt-nickel, chromium-cobalt-nickel, chromium-cobalt, chromium-nickel, chromium-silicon, chromium-copper, chromium-aluminum, aluminum-silicon-copper, aluminum-silicon, or aluminum-chromium.

12. The method of claim 10, wherein a top metal film in a stack of multiple thin film metals defining the metal film pattern is directly electroplate-able and comprises one of the following metal layers: silver, copper, nickel, chromium, nickel-niobium, nickel-vanadium, nickel-titanium, nickel-zirconium, nickel-chromium, nickel-platinum, nickel-aluminum, nickel-tungsten, chromium-cobalt-nickel, chromium-cobalt, chromium-nickel, chromium-silicon, chromium-copper or chromium-aluminum.

13. The method of claim 1, wherein the laser irradiation is pulsed with a pulse width of less than 200 nsec and average power density less than 2 joules per square centimeter.

14. The method of claim 1, wherein the laser irradiation has a wavelength in the range 250 nm to 2000 nm.

15. The method of claim 1, wherein the laser irradiation has a top-hat beam profile.

16. The method of claim 1, wherein the substrate is a silicon wafer with one or both main surfaces thereof being textured to improve light trapping.

17. The method of claim 1, wherein the laser irradiation has a wavelength in the range 900 nm to 2000 nm.

18. The method of claim 1, wherein the laser irradiation leaves unchanged optical properties and electrical properties of the substrate and the coating over the substrate within the exposure area.

* * * * *